(12) United States Patent
Anderson et al.

(10) Patent No.: US 10,020,224 B2
(45) Date of Patent: Jul. 10, 2018

(54) SELF-ALIGNED VIA FORMING TO CONDUCTIVE LINE AND RELATED WIRING STRUCTURE

(71) Applicant: GLOBALFOUNDRIES INC., Grand Cayman, KY (US)

(72) Inventors: Brent A. Anderson, Jericho, VT (US); Edward J. Nowak, Shelburne, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/980,320

(22) Filed: Dec. 28, 2015

(65) Prior Publication Data

US 2017/0186682 A1    Jun. 29, 2017

(51) Int. Cl.
| | |
|---|---|
| *H01L 21/768* | (2006.01) |
| *H01L 21/311* | (2006.01) |
| *H01L 21/3105* | (2006.01) |
| *H01L 23/522* | (2006.01) |
| *H01L 23/532* | (2006.01) |
| *H01L 23/528* | (2006.01) |

(52) U.S. Cl.
CPC .. *H01L 21/76835* (2013.01); *H01L 21/31051* (2013.01); *H01L 21/31053* (2013.01); *H01L 21/31144* (2013.01); *H01L 21/7681* (2013.01); *H01L 21/76819* (2013.01); *H01L 21/76832* (2013.01); *H01L 21/76834* (2013.01); *H01L 21/76877* (2013.01); *H01L 21/76897* (2013.01); *H01L 23/5226* (2013.01); *H01L 23/5283* (2013.01); *H01L 23/53295* (2013.01)

(58) Field of Classification Search
CPC ............... H01L 23/528; H01L 23/5329; H01L 23/5226; H01L 23/5283; H01L 23/53295; H01L 21/31051; H01L 21/31144; H01L 21/76802; H01L 21/76834; H01L 21/76877; H01L 21/76897; H01L 21/76835; H01L 21/76832; H01L 21/76819
See application file for complete search history.

(56) References Cited

U.S. PATENT DOCUMENTS

| | | |
|---|---|---|
| 6,133,144 A | 10/2000 | Tsai et al. |
| 6,211,063 B1 | 4/2001 | Liu et al. |
| 8,415,248 B2 | 4/2013 | Chen et al. |

*Primary Examiner* — Brigitte Paterson
(74) *Attorney, Agent, or Firm* — David Cain; Hoffman Warnick LLC

(57) ABSTRACT

A method of forming a via and a wiring structure formed are disclosed. The method may include forming a conductive line in a first dielectric layer; forming a hard mask adjacent to the conductive line after the conductive line forming; forming a second dielectric layer over the hard mask; and forming a via opening to the conductive line in the second dielectric layer. The via opening lands at least partially on the hard mask to self-align the via opening to the conductive line. A via may be formed by filling the via opening with a conductor.

10 Claims, 6 Drawing Sheets

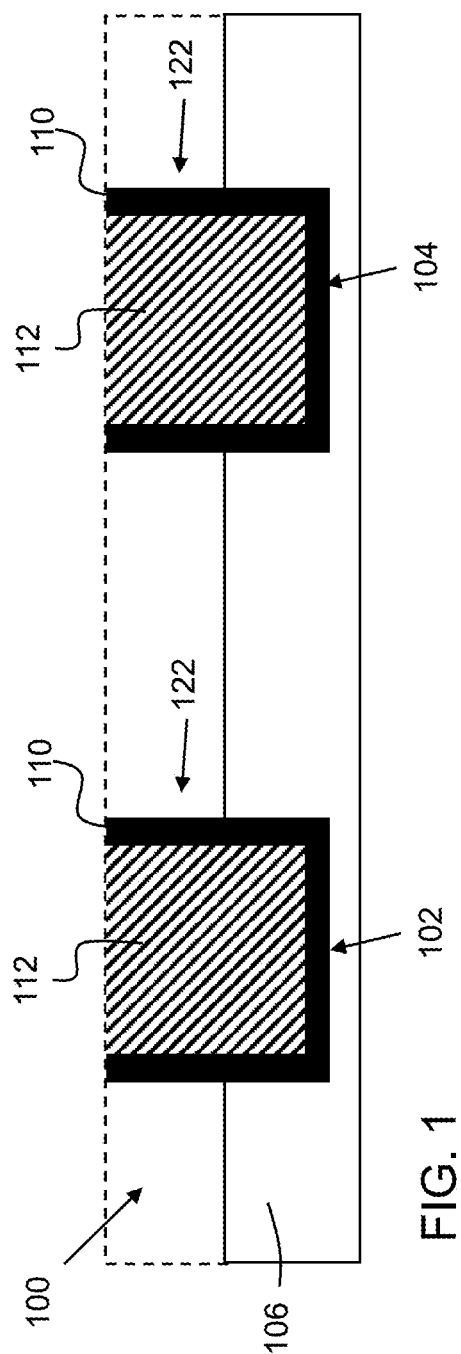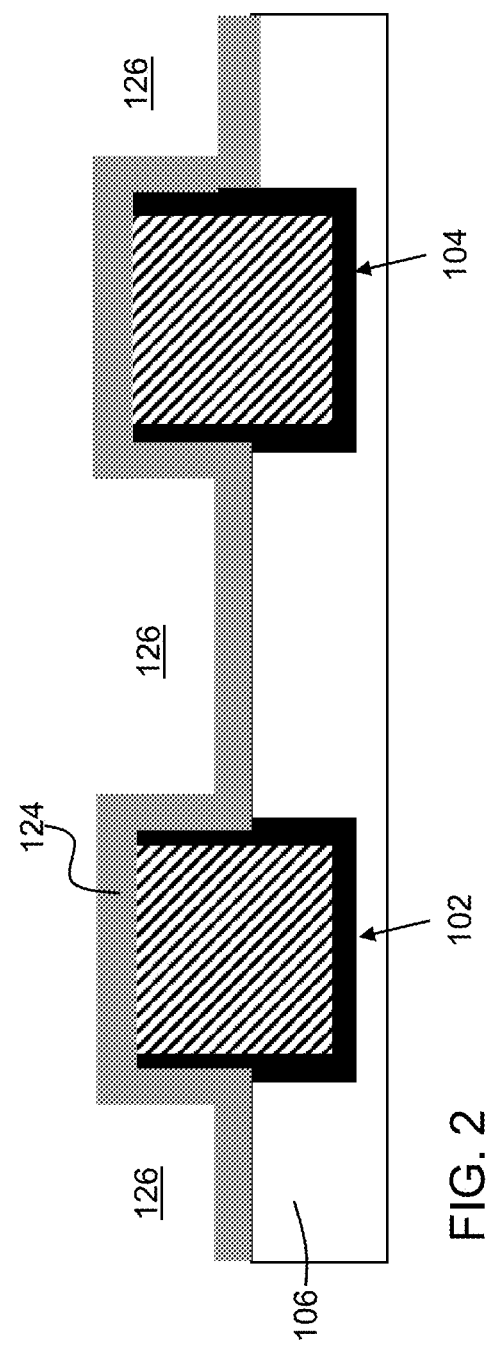

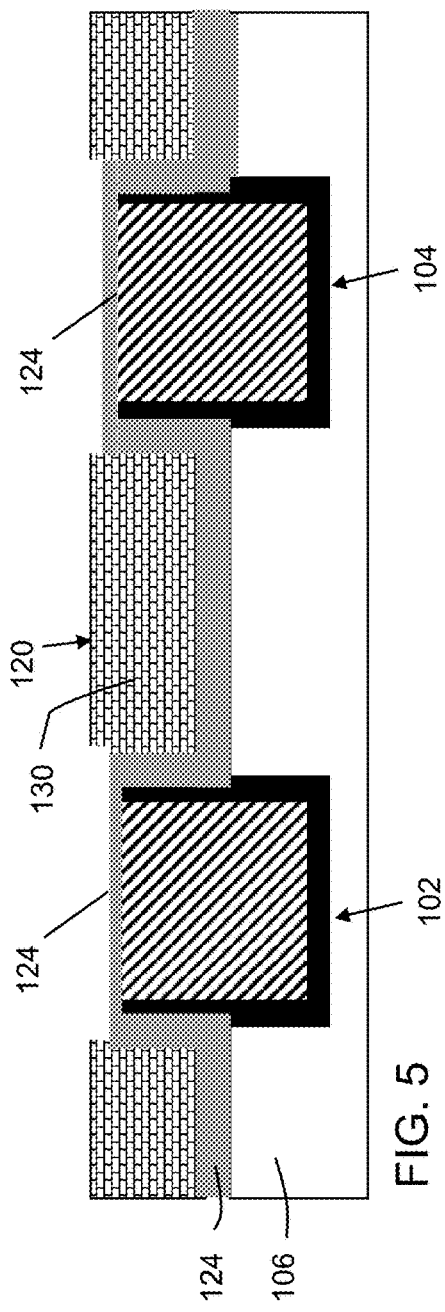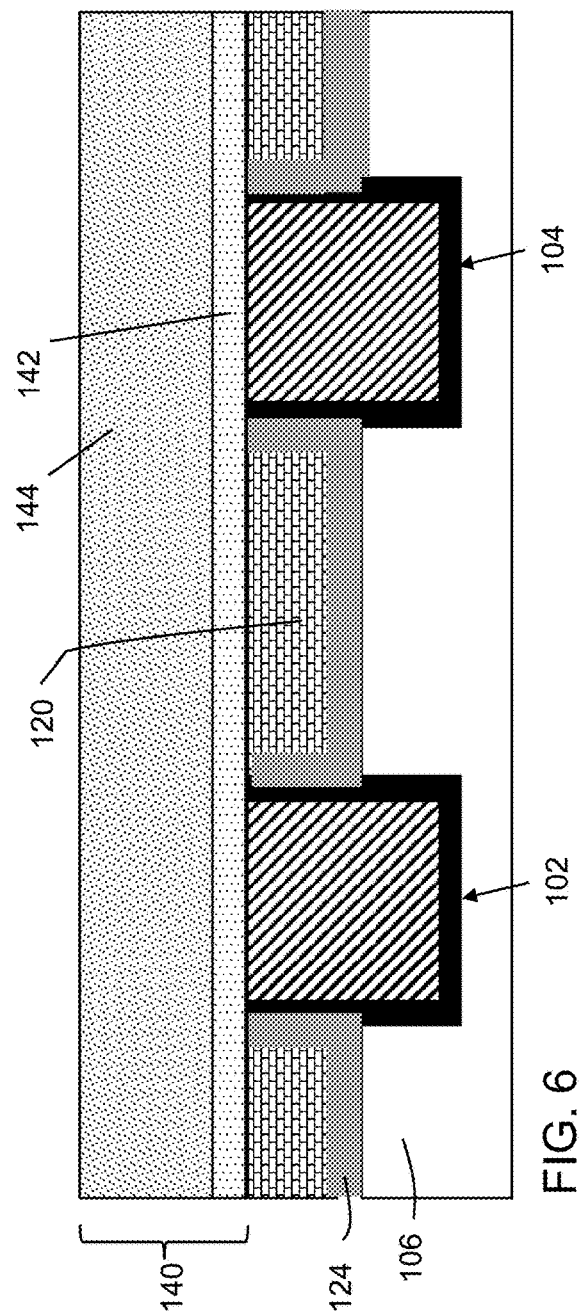

SELF-ALIGNED VIA FORMING TO CONDUCTIVE LINE AND RELATED WIRING STRUCTURE

BACKGROUND

Technical Field

The present disclosure relates to semiconductor fabrication, and more specifically, to a method of forming a self-aligned via to a conductive line with no additional lithography steps required, and a related wiring structure.

Related Art

In the semiconductor fabrication industry, continued miniaturization of wiring structures requires changes in processes to achieve desired wiring minimum pitches. For example, advanced technology nodes are now moving to using multiple patterning and self-aligned features in the back-end-of-line (BEOL) processing to achieve the desired wiring minimum pitch. BEOL processing is performed on the semiconductor wafer in the course of device manufacturing following first metallization, i.e., that is the layer over the device layer in which transistors and other structures are provided. BEOL processing builds increasingly larger wiring structures in layers of the integrated circuit to interconnect different devices. BEOL processing typically includes forming conductive lines or wires in a dielectric layer that are coupled vertically by conductive vias in another dielectric layer thereover.

Alignment of a bottom of a via to a conductive line below is affected by overlay errors, e.g., photolithography masks patterning via openings that do not adequately align to a conductive line below. Misalignment of a via with a conductive line below can lead to a number of issues including higher via resistance, shorting, electro-migration leading to shorting, and an electrical open or lack of connection between via and conductive line. Current technology acts to self-align vias to conductive lines below by using masking to define an alignment feature above the conductive line that then controls the edge of a later formed via. This approach requires significant extra cost in creating special masking and/or etching steps to create the alignment features, and may still result in alignment error.

SUMMARY

A first aspect of the disclosure is directed to a method of forming a via, the method comprising: forming a conductive line in a first dielectric layer; forming a hard mask adjacent to the conductive line after the conductive line forming; forming a second dielectric layer over the hard mask; forming a via opening to the conductive line in the second dielectric layer, the via opening landing at least partially on the hard mask to self-align the via opening to the conductive line; and forming the via by filling the via opening with a conductor.

A second aspect of the disclosure includes a method of forming a via, the method comprising: forming a pair of conductive lines in a first dielectric layer; forming a hard mask between the pair of conductive lines after the pair of conductive line forming; forming a second dielectric layer over the hard mask; forming a via opening in the second dielectric layer to a selected conductive line of the pair of conductive lines, the via opening landing at least partially on the hard mask to self-align the via opening to the selected conductive line; and forming the via by filling the via opening with a conductor.

A third aspect of the disclosure related to a wiring structure for an integrated circuit, the wiring structure comprising: a conductive line in a first dielectric layer; a hard mask adjacent to the conductive line; a second dielectric layer over the hard mask; and a via to the conductive line in the second dielectric layer, the via landing at least partially on the hard mask to self-align the via to the conductive line.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 1-9 show cross-sectional views of embodiments of a method according to the disclosure, with FIGS. 8 and 9 showing a cross-sectional views of a wiring structure according to embodiments of the disclosures.

DETAILED DESCRIPTION

Figure 3:
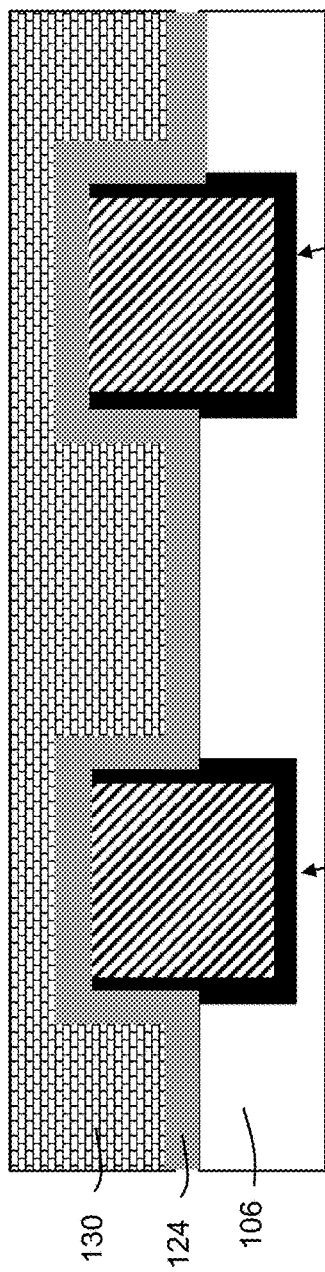

Referring to the drawings, embodiments of a method of forming a via will be described. FIG. 1 shows a cross-sectional view of a preliminary structure 100 including a conductive line 102. Embodiments of the disclosure can be applied to single conductive line 102 or a pair of conductive lines 102, 104. In any event, conductive line(s) 102, 104 may be formed in a first dielectric layer 106. Dielectric layer 106 may be part of any metal layer in a BEOL of an integrated circuit, and may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Conductive line(s) 102, 104 may be formed using any now known or later developed technology. For instances, patterning a mask over first dielectric layer 106, etching the mask, etching an opening in layer 106, depositing a liner, depositing a metal and planarizing. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Conductive line(s) 102, 104 may also be formed as part of a dual damascene arrangement in which vias extending downwardly from new conductive line(s) (not shown) are simultaneously formed. Each conductive line 102, 104, may include a refractory metal liner 110 and a conductive material 112. Refractory metal liner 110 may include but is not limited to: tantalum (Ta), titanium (Ti), tungsten (W), iridium (Ir), rhodium (Rh) and platinum (Pt), ruthenium (Ru), etc., or mixtures of thereof. Conductive material 112 may include but is not limited to: tungsten (W), copper (Cu), and aluminum (Al).

Embodiments of forming a hard mask 120 (FIG. 5) adjacent to conductive line 102 after the conductive line forming will be described relative to FIGS. 1-5. As shown in FIG. 1, first dielectric layer 106 may be etched to expose an upper portion 122 of conductive line(s) 102, 104. Here, the phantom portion of first dielectric layer 106 would be removed. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In the instant case, the etching may be, for example, RIE.

FIG. 2 shows depositing a first conformal cap layer 124, leaving a mask opening 126 adjacent conductive line 102. That is, mask opening 126 is laterally adjacent exposed portion 122 (FIG. 1) of conductive line 102. First conformal cap layer 124 may have a thickness of 5 nanometers (nm) to approximately 50 nm. As used herein, "approximately" may indicate +/−10% of the stated value(s). As illustrated, where a pair of conductive lines 102, 104 are provided, mask opening 126 is positioned between portions of conductive lines 102, 104 above first dielectric layer 106. First conformal cap layer 124 may include, for example, a low temperature oxide (LTO), or silicon dioxide ($SiO_2$). First conformal cap layer 124 is shown extending over conductive line(s) 102, 104, but this is not necessary in all instances. First conformal layer 124 may be deposited, for example, using CVD.

FIG. 3 shows depositing a second cap layer 130 in mask opening 126 (FIG. 2). In embodiments, second cap layer 130 may fill mask opening 126; however, this is not necessary in all cases. Second cap layer 130 may have a thickness of 5 nanometers (nm) to approximately 500 nm. Second cap layer 130 may include, for example, silicon nitride ($Si_3N_4$), silicon oxygen carbon nitride (SiOCN), silicon boron carbon nitride (SiBCN) or aluminum oxide ($Al_2O_3$). Second cap layer 130 may have a higher dielectric constant (k) than first conformal cap layer 124, e.g., in the range of approximately 5 times to approximately 14 times that of a vacuum. Further, in one embodiment, second cap layer 130 may have a higher etch selectivity than first conformal cap layer 124, e.g., preferably approximately 2.5 to approximately 3 times greater than cap layer 124. Second cap layer 130 may be deposited, for example, using CVD.

Figure 4:
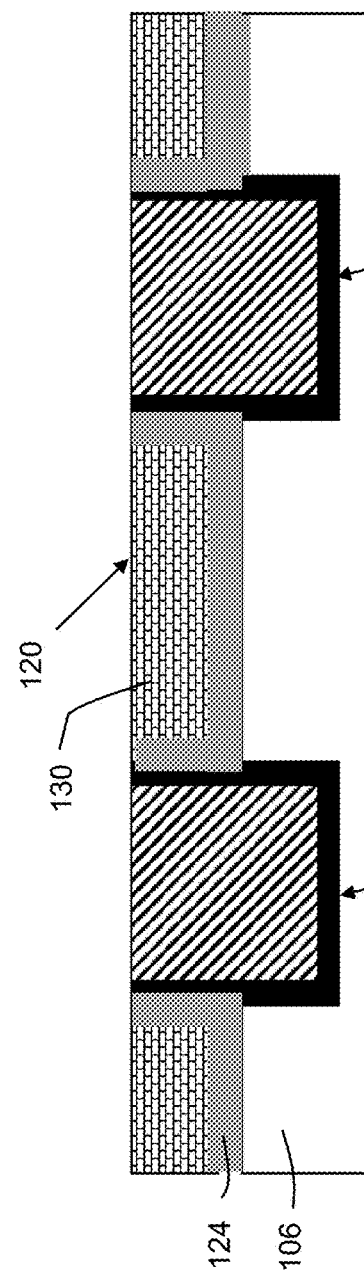

FIG. 4 shows planarizing first conformal cap layer 124 and second cap layer 130 to form hard mask 120 from second cap layer 130. The planarizing may include any now known or later developed method of removing layers of solid by chemical-mechanical polishing commonly carried out for the purpose of surface planarization and definition of metal interconnect pattern. As illustrated, hard mask 120 is adjacent to conductive line 102 or 104 and, where two lines are provided, between pair of conductive lines 102, 104.

FIG. 5 shows a few alternative embodiments. For example, in one embodiment, a portion of first conformal cap layer 124 may remain over conductive line(s) 102, 104 after the planarizing, and second cap layer 130 is removed over conductive line(s) 102, 104 by the planarizing. In another alternative embodiment, second cap layer 130 may be higher than first conformal cap layer 124 after the planarizing, e.g., because second cap layer 130 has a lower etching rate than first conformal cap layer 124. While the alternative embodiments have been shown together, it is emphasized that they may occur separately.

FIG. 6 shows forming a second dielectric layer 140 over hard mask 130 (and conductive line(s) 102, 104). Second dielectric layer 140 may include any of the material(s) listed for first dielectric layer 106, or layers thereof. In one embodiment, as shown, second dielectric layer 140 may include a silicon nitride ($Si_3N_4$) barrier layer 142 and a silicon oxide ($SiO_2$) layer 144. As understood in the field, a variety of other arrangements are also possible. Second dielectric layer 140 may have a thickness of 50 nanometers (nm) to approximately 1000 nm.

Figure 7:
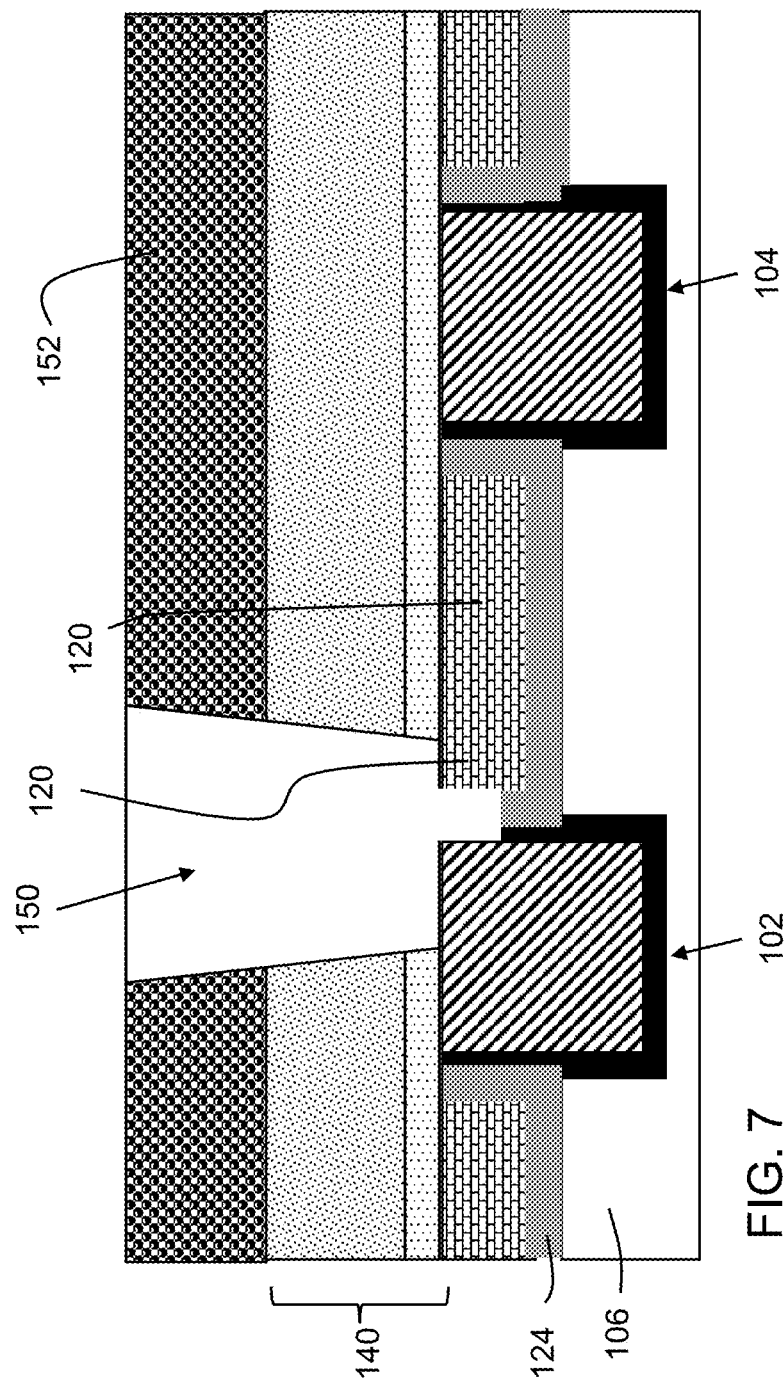

FIG. 7 shows forming a via opening 150 to conductive line 102 in second dielectric layer 140. As illustrated, via opening 150 lands at least partially on hard mask 120 to self-align via opening 150 to conductive line 102. Via opening 150 may be formed by depositing and patterning a mask 152, etching mask 152, etching second dielectric layer 140, and stripping mask 152. The etching may include any of the aforementioned etching processes appropriate for the material present, for example, a RIE. Forming via opening 150 using hard mask 120 acts to self-align via opening 150 to conductive line 102 since hard mask 120 prevents unwanted etching of surrounding materials, except first conformal cap layer 124. In contrast to conventional processes, however, embodiments described herein do not require additional alignment structures above conductive lines 102, 104, and do not require the associated steps (and costs) of the deposition, masking and etching steps required to form those structures.

Figure 8:
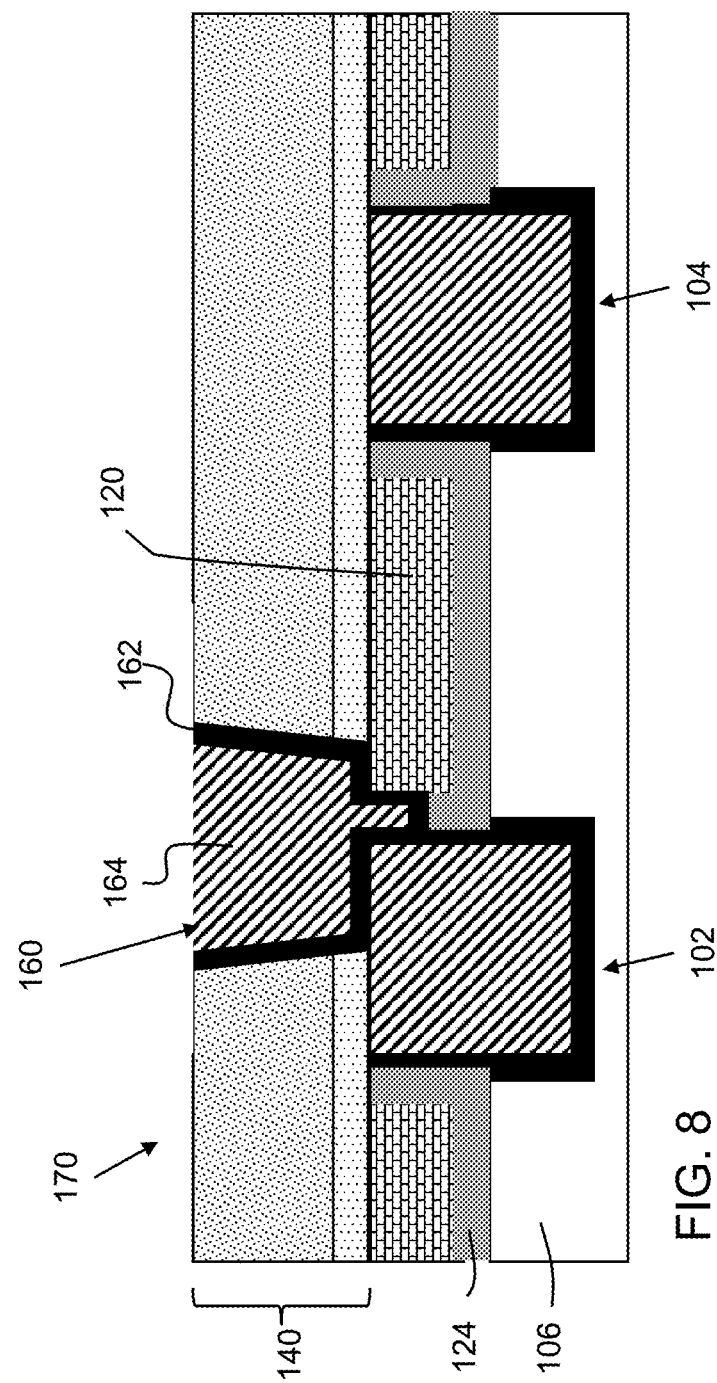

FIG. 8 shows forming via 160 by filling via opening 150 (FIG. 7) with a conductor. Via forming may include, for example, depositing a refractory metal liner 162 (of materials listed for liner 110 (FIG. 1)) and a conductive material 164 (of material(s) listed for conductive material 112 (FIG. 1)). Although not shown, via 160 may be formed as part of dual damascene technique to simultaneously form vias in second dielectric layer 140 and conductive lines in another dielectric layer thereover.

Figure 9:
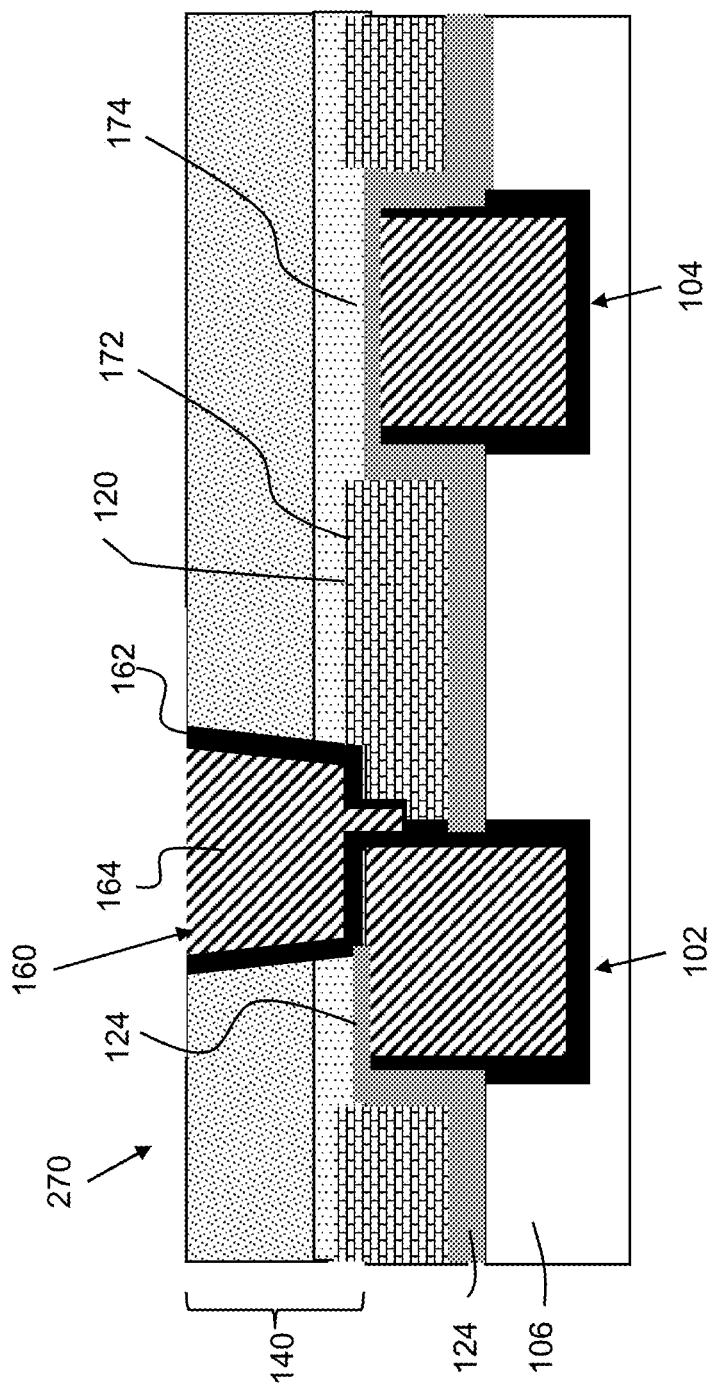

FIG. 8 also shows a wiring structure 170 for an integrated circuit according to embodiments of the disclosure. In one embodiment, wiring structure 170 may include: conductive line 102 in first dielectric layer 106. A hard mask 120 may be adjacent to conductive line 102, and second dielectric layer 140 may be positioned over hard mask 120. Via 160 to conductive line 102 is positioned in second dielectric layer 140, and via 160 lands at least partially on hard mask 120 to self-align the via to the conductive line. FIG. 9 shows a wiring structure 270 with the alternative embodiments of FIG. 5. In this case, a portion of conformal cap layer 124 may remain over an upper portion 122 (FIG. 1) of conductive line 102. That is, a portion of conformal cap layer 124 extends over conductive line 102, and second cap layer 130 does not extend over first conformal cap layer 124 over conductive line 102. In addition thereto, or as an alternative, an upper surface 172 of hard mask 120 may extend beyond an upper surface 174 of conformal cap layer 124. As noted herein, hard mask 120 may have a higher dielectric constant than conformal cap layer 124, and a higher etch selectivity than conformal cap layer 124. As shown in FIGS. 8 and 9, the conductive line may include a pair of conductive lines 102, 104 in which case hard mask 120 is positioned between the pair of conductive lines.

Methods according to the disclosure provide via self-alignment of via 160 by way of hard mask 120 at a bottom of the via, making the process much less susceptible to overlay errors. The wiring structure and method forms an alignment feature directly from the existing line edge so that the feature is self-aligned, with no lithography steps for self-aligning features. Vias 170, 270 also have lower via resistance. Hard mask 120 deposited between adjacent lines prevents bottom of vias 170, 270 from shorting to adjacent conductive lines. The alignment feature is also formed at the bottom line so that the bottom edge of vias 170, 270 are directly controlled to the line edge. By avoiding masking steps and forming the feature above the conductive lines, the costs and alignment errors are minimized.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method of forming a via, the method comprising:
    forming a conductive line in a first dielectric layer;
    etching the first dielectric layer to expose an upper portion of the conductive line;
    depositing a first conformal cap layer, leaving a mask opening adjacent the conductive line;
    forming a hard mask adjacent to the conductive line after depositing the first conformal cap layer, the forming the hard mask including:
        depositing a second cap layer in the mask opening, and
        planarizing the first conformal cap layer and the second cap layer to form the hard mask from the second cap layer, wherein the planarizing includes entirely removing the second cap layer from above the conductive line;
    forming a second dielectric layer over the hard mask;
    forming a via opening to the conductive line in the second dielectric layer, the forming the via opening stopping at the hard mask, and the via opening landing at least partially on the hard mask to self-align the via opening to the conductive line; and
    forming the via by filling the via opening with a conductor.

2. The method of claim 1, wherein a portion of the first conformal cap layer remains over the conductive line after the planarizing.

3. The method of claim 1, wherein the second cap layer is selected from the group consisting of: silicon nitride, silicon oxygen carbon nitride, silicon boron carbon nitride and aluminum oxide.

4. The method of claim 1, wherein the second cap layer has a higher dielectric constant than the first conformal cap layer.

5. The method of claim 1, wherein the second cap layer is higher than the first conformal cap layer after the planarizing.

6. The method of claim 1, wherein the second cap layer has a higher etch selectivity than the first conformal cap layer.

7. The method of claim 1, wherein the conductive line forming includes forming a pair of conductive lines, and wherein the hard mask forming includes forming the hard mask between the pair of conductive lines.

8. A method of forming a via, the method comprising:
    forming a pair of conductive lines in a first dielectric layer;
    etching the first dielectric layer to expose an upper portion of each of the pair of conductive lines;
    depositing a first conformal cap layer, leaving a mask opening between the pair of conductive lines;
    forming a hard mask between the pair of conductive lines after depositing the first conformal cap layer, the forming the hard mask including:
        depositing a second cap layer in the mask opening, and
        planarizing the first conformal cap layer and the second cap layer to form the hard mask from the second cap layer, wherein the planarizing includes entirely removing the second cap layer above the conductive line;
    forming a second dielectric layer over the hard mask;
    forming a via opening in the second dielectric layer to a selected conductive line of the pair of conductive lines, the via opening landing at least partially on the hard mask to self-align the via opening to the selected conductive line; and
    forming the via by filling the via opening with a conductor.

9. The method of claim 8, wherein a portion of the first conformal cap layer remains over the pair of conductive lines after the planarizing.

10. The method of claim 8, wherein the second cap layer is selected from the group consisting of: silicon nitride, silicon oxygen carbon nitride, silicon boron carbon nitride and aluminum oxide.

\* \* \* \* \*